(12) United States Patent
Yan et al.

(10) Patent No.: US 11,489,139 B2
(45) Date of Patent: Nov. 1, 2022

(54) DISPLAY PANEL, PREPARATION METHOD THEREOF, AND DISPLAY APPARATUS

(71) Applicants: Ordos Yuansheng Optoelectronics Co., Ltd., Inner Mongolia (CN); BOE Technology Group Co., Ltd., Beijing (CN)

(72) Inventors: Xiaofeng Yan, Beijing (CN); Liangliang Liu, Beijing (CN); Liman Peng, Beijing (CN); Lingling Ma, Beijing (CN); Hongyu Mi, Beijing (CN); Le Gao, Beijing (CN)

(73) Assignees: Ordos Yuansheng Optoelectronics Co., Ltd., Inner Mongolia (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/210,424

(22) Filed: Mar. 23, 2021

(65) Prior Publication Data
US 2021/0376285 A1     Dec. 2, 2021

(30) Foreign Application Priority Data
May 27, 2020 (CN) .......................... 202010462388.2

(51) Int. Cl.
*H01L 51/52* (2006.01)
*H01L 51/56* (2006.01)
(Continued)

(52) U.S. Cl.
CPC ........ *H01L 51/5246* (2013.01); *G06F 3/0412* (2013.01); *H01L 51/56* (2013.01);
(Continued)

(58) Field of Classification Search
CPC . H01L 51/5246; H01L 51/56; H01L 27/3276; G06F 3/041; G06F 3/0412
See application file for complete search history.

(56) References Cited

U.S. PATENT DOCUMENTS 9,224,791 B2 * 12/2015 Kim .................... H01L 27/3272
9,886,113 B2 * 2/2018 Choi .................... G06F 3/0443
(Continued)

FOREIGN PATENT DOCUMENTS

| CN | 106371649 A | 2/2017 |
| CN | 107039496 A | 8/2017 |

(Continued)

OTHER PUBLICATIONS

The First Office Action dated Aug. 3, 2022 for Chinese Patent Application No. 202010462388.2 and English Translation.

*Primary Examiner* — Sardis F Azongha
(74) *Attorney, Agent, or Firm* — Ling Wu; Stephen Yang; Ling and Yang Intellectual Property

(57) ABSTRACT

Provided are a display panel, a preparation method thereof and a display apparatus. The display panel includes a display substrate and a cover plate oppositely disposed. The display substrate includes an array substrate, pixel define layers on the array substrate, pixel support layers on a side of the pixel define layers away from the array substrate, and second electrodes each located on a side of each of the pixel support layers away from each pixel define layers. The cover plate includes a first substrate, a touch sensor layer and protective layer disposed on the first substrate, wherein multiple openings are disposed on the touch sensor layer and covered by the protective layer. An orthographic projection of each of the openings on the array substrate at least partially overlaps with that of a surface on a side of each of the pixel support layers away from the array substrate.

13 Claims, 4 Drawing Sheets

(51) Int. Cl.
*G06F 3/041* (2006.01)
*H01L 27/32* (2006.01)

(52) U.S. Cl.
CPC .............. *G06F 2203/04103* (2013.01); *H01L 27/3246* (2013.01); *H01L 2227/323* (2013.01)

(56) References Cited

U.S. PATENT DOCUMENTS

| | | | |
|---|---|---|---|
| 10,199,440 B2* | 2/2019 | Park | G06F 3/044 |
| 10,503,293 B2* | 12/2019 | Seong | G06F 3/0412 |
| 10,651,244 B2* | 5/2020 | Wang | G06F 3/04164 |
| 10,892,306 B1* | 1/2021 | Fang | G06F 3/0443 |
| 2015/0162387 A1* | 6/2015 | Gu | G06F 3/0412 |
| | | | 345/174 |
| 2017/0024075 A1 | 1/2017 | Chiang et al. | |
| 2017/0205959 A1* | 7/2017 | Seong | G06F 3/0448 |
| 2017/0207277 A1 | 7/2017 | Park | |
| 2018/0329553 A1 | 11/2018 | Chiang et al. | |
| 2019/0196630 A1* | 6/2019 | Lai | G06F 3/0443 |
| 2019/0319076 A1* | 10/2019 | Lee | G06F 3/0412 |
| 2020/0057520 A1 | 2/2020 | Hung et al. | |
| 2020/0321417 A1 | 10/2020 | Cheng et al. | |
| 2020/0411597 A1 | 12/2020 | Fang et al. | |
| 2021/0294445 A1 | 9/2021 | Du et al. | |
| 2021/0307697 A1* | 10/2021 | Hong | H01L 27/3225 |

FOREIGN PATENT DOCUMENTS

| | | |
|---|---|---|
| CN | 108563353 A | 9/2018 |
| CN | 108874247 A | 11/2018 |
| CN | 109427848 A | 3/2019 |
| CN | 109445638 A | 3/2019 |
| CN | 109871159 A | 6/2019 |
| CN | 110045867 A | 7/2019 |
| CN | 110209306 A | 9/2019 |
| CN | 110286803 A | 9/2019 |

\* cited by examiner

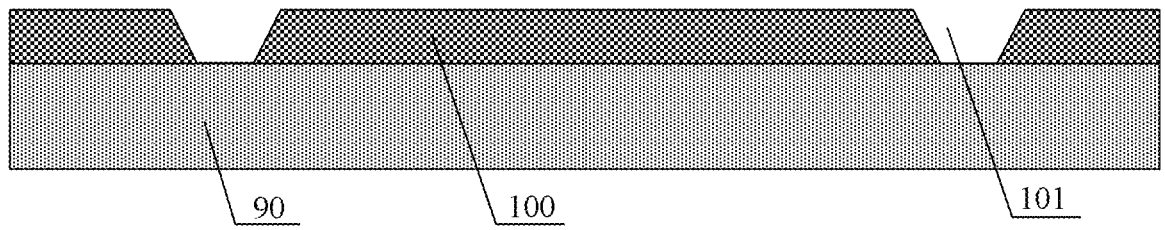

FIG. 9

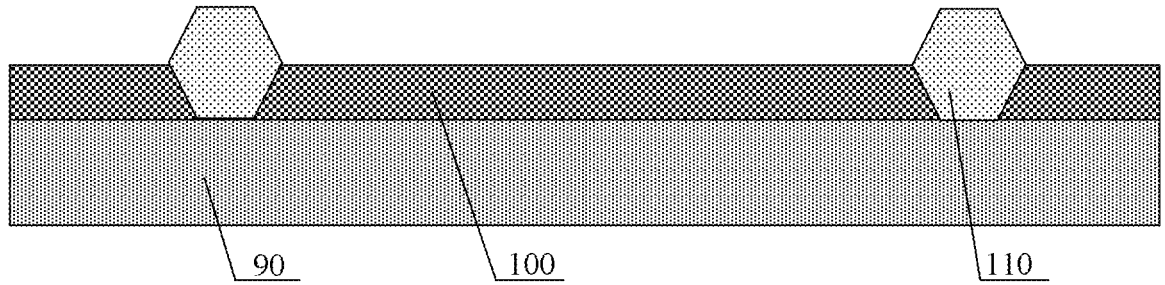

FIG. 10

| Form a display substrate and a cover plate respectively, the display substrate including an array substrate, pixel define layers on the array substrate, pixel support layers on a side of the pixel define layers away from the array substrate, and second electrodes each located on a side of each of the pixel support layers away from each of the pixel define layers; the cover plate including a first substrate, a touch sensor layer and a protective layer which are disposed on the first substrate, multiple openings being disposed on the touch sensor layer and covered by the protective layer | S1 |

| Bond and encapsulate the display substrate and the cover plate, an orthographic projection of each of the openings on the array substrate coinciding with that of a surface on a side of each of the pixel support layers away from the array substrate | S2 |

FIG. 11

DISPLAY PANEL, PREPARATION METHOD THEREOF, AND DISPLAY APPARATUS

CROSS-REFERENCE TO RELATED APPLICATION

The present disclosure claims the priority of Chinese Patent Application No. 202010462388.2 filed to the CNIPA on May 27, 2020, the entire content of which is hereby incorporated by reference.

TECHNICAL FIELD

Embodiments of the present disclosure relate to, but are not limited to, the field of display technology, and particularly relate to a display substrate, a preparation method thereof, and a display apparatus.

BACKGROUND

An Organic Light Emitting Diode (OLED) is an active light emitting display device, and has advantages of self-emission, wide angle of view, high contrast, low power consumption, extremely high response speed, etc. With the continuous development of display technology, the OLED technology is increasingly applied in flexible display apparatuses.

The incell touch screen has a touch sensor structure disposed within the display panel, which has advantages of simple structure, lightness, thinness, and low cost and the like, and has increasingly become the mainstream technology of the touch screen. However, in the incell OLED panel, there is a large parasitic capacitance between a touch sensor layer and a cathode of the display panel, causing a current passing through the cathode greatly affects the capacitance value and thereby affecting the sensitivity of the touch sensor to external touch signals.

SUMMARY

The following is a summary of the subject matter described in detail in the present disclosure. This summary is not intended to limit the protection scope of the claims.

An embodiment of the present disclosure provides a display panel including a display substrate and a cover plate which are oppositely disposed. The display substrate includes an array substrate, pixel define layers on the array substrate, pixel support layers on a side of the pixel define layers away from the array substrate, and second electrodes each located on a side of each of the pixel support layers away from each of the pixel define layers. The cover plate includes a first substrate, a touch sensor layer and a protective layer which are disposed on the first substrate, wherein multiple openings are disposed on the touch sensor layer and are covered by the protective layer. An orthographic projection of each of the openings on the array substrate at least partially overlaps with that of a surface on a side of each of the pixel support layers away from the array substrate.

In an exemplary embodiment, the orthographic projection of each of the multiple openings on the array substrate coincides with that of the surface on the side of each of the pixel support layers away from the array substrate.

In an exemplary embodiment, the protective layer includes multiple protective columns disposed at intervals which cover the openings.

In an exemplary embodiment, a section of each of the multiple protective columns is hexagonal.

In an exemplary embodiment, a length of each of the multiple protective columns in a direction perpendicular to the cover plate is greater than that of the touch sensor layer in the direction perpendicular to the cover plate.

In an exemplary embodiment, a second electrode between adjacent pixel define layers, protective columns and the touch sensor layer form an enclosed space which is in a vacuum state or filled with nitrogen or an inert gas.

In an exemplary embodiment, at least part of side surfaces of the plurality of protective columns contact with the touch sensor layer.

In an exemplary embodiment, a part of the second electrode is sandwiched by the protective column and the pixel support layer.

In an exemplary embodiment, the second electrodes contact with the plurality of protective columns and the pixel support layers.

An embodiment of the present disclosure further provides a display apparatus including a display panel which includes a display substrate and a cover plate that are oppositely disposed.

The display substrate includes an array substrate, pixel define layers on the array substrate, pixel support layers on a side of the pixel define layers away from the array substrate, and second electrodes each located on a side of each of the pixel support layers away from each of the pixel define layers.

The cover plate includes a first substrate, a touch sensor layer and a protective layer which are disposed on the first substrate, wherein the touch sensor layer is provided with multiple openings which are covered by the protective layer. An orthographic projection of each of the multiple openings on the array substrate at least partially overlaps with that of a surface on a side of each of the pixel support layers away from the array substrate.

In an exemplary embodiment, the orthographic projection of each of the multiple openings on the array substrate coincides with that of the surface on the side of each of the pixel support layers away from the array substrate.

In an exemplary embodiment, the protective layer includes multiple protective columns disposed at intervals which cover the openings.

In an exemplary embodiment, a section of each of the multiple protective columns is hexagonal.

In an exemplary embodiment, a length of each of the multiple protective columns in a direction perpendicular to the cover plate is greater than that of the touch sensor layer in the direction perpendicular to the cover plate.

In an exemplary embodiment, a second electrode between adjacent pixel define layers, protective columns and the touch sensor layer form an enclosed space which is in a vacuum state or filled with nitrogen or an inert gas.

In an exemplary embodiment, at least part of side surfaces of the plurality of protective columns contact with the touch sensor layer.

In an exemplary embodiment, a part of the second electrode is sandwiched by the protective column and the pixel support layer.

An embodiment of the present disclosure further provides a preparation method of a display panel, which includes: forming a display substrate and a cover plate respectively, wherein the display substrate includes an array substrate, pixel define layers on the array substrate, pixel support layers on a side of the pixel define layers away from the array substrate, and second electrodes each located on a side of each of the pixel support layers away from each of the pixel define layers; the cover plate includes a first substrate, a touch sensor layer and a protective layer which are disposed on the first substrate, wherein multiple openings are disposed on the touch sensor layer, and the multiple openings are covered by the protective layer; the display substrate and the cover plate are bonded and encapsulated, wherein an orthographic projection of each of the multiple openings on the array substrate at least partially overlaps with that of a surface on a side of each of the pixel support layers away from the array substrate.

In an exemplary embodiment, forming the cover plate includes forming the touch sensor layer on the first substrate and forming the multiple openings on the touch sensor layer; forming the protective layer on the touch sensor layer, wherein the protective layer covers the multiple openings.

In an exemplary embodiment, forming the cover plate includes etching a protective layer between the multiple openings to form multiple protective columns disposed at intervals which cover the openings.

In an exemplary embodiment, a section of each of the protective columns is hexagonal. In an exemplary embodiment, a length of each of the multiple protective columns in a direction perpendicular to the cover plate is greater than that of the touch sensor layer in the direction perpendicular to the cover plate.

In an exemplary embodiment, bonding and encapsulating the display substrate and the cover plate includes bonding and encapsulating the display substrate and the cover plate in vacuum, nitrogen or an inert gas, so that an enclosed space formed by a second electrode between adjacent pixel define layers, the protective columns and the touch sensor layer is in a vacuum state or filled with the nitrogen or the inert gas.

In an exemplary embodiment, bonding and encapsulating the display substrate and the cover plate further includes: connecting each of the multiple protective columns on the cover plate to each of the second electrodes on the display substrate, wherein each of the multiple protective columns corresponds to each of the pixel support layers in position, and a second electrode between adjacent pixel define layers, the protective columns and the touch sensor layer form an enclosed space.

In an exemplary embodiment, acts of forming the display substrate include: forming a pixel structural layer pattern on the array substrate; forming a planarization layer covering a whole array substrate on the array substrate on which the pixel structural layer pattern is formed, and forming via holes on the planarization layer to obtain a first substrate; forming a first electrode pattern on the first substrate to obtain a second substrate; forming a pixel define layer pattern on the second substrate to obtain a third substrate; forming a pixel support layer pattern on the third substrate to obtain a fourth substrate; forming an organic light emitting layer on the fourth substrate to obtain a fifth substrate; forming a second electrode pattern on the fifth substrate.

Of course, an implementation of any product or method in the embodiments of the present disclosure does not need to achieve all the advantages mentioned above at the same time. Other features and advantages of the present disclosure will be set forth in the following embodiments of the specification, and in part will become apparent from the embodiments of the specification, or be learned by implementing the present disclosure. Purposes and other advantages of the embodiments of the present disclosure may be achieved and acquired by structures specified in the specification and drawings.

Other aspects will become apparent upon reading and understanding accompanying drawings and the detailed description.

BRIEF DESCRIPTION OF DRAWINGS

The accompanying drawings are used to provide a further understanding of the technical schemes of the present disclosure, and constitute a part of the description. They are used together with the embodiments of the present disclosure to explain the technical schemes of the present disclosure, and do not constitute a restriction on the technical schemes of the present disclosure. Shapes and sizes of the components in the drawings do not reflect true proportions, and the purpose is only for schematically illustrating contents of the present disclosure.

FIG. 9 is a schematic diagram of a first substrate after a touch sensor layer pattern is formed according to an embodiment of the present disclosure.

FIG. 10 is a schematic diagram of a first substrate after a protective layer pattern is formed according to an embodiment of the present disclosure.

FIG. 11 is a schematic flowchart of a preparation method of a display panel according to an embodiment of the present disclosure.

DETAILED DESCRIPTION

Specific implementations of the present disclosure will be described in further detail below with reference to the accompanying drawings and embodiments. The following embodiments serve to illustrate the present disclosure, but are not intended to limit the scope of the present disclosure. It should be noted that embodiments in the present disclosure and features in the embodiments may be combined with each other arbitrarily if there is no conflict.

Embodiments of the present disclosure provide a display panel, a preparation method thereof, and a display apparatus, which can reduce parasitic capacitance generated between a touch sensor layer and a cathode of the display panel.

An embodiment of the present disclosure provides a display panel including a display substrate and a cover plate which are oppositely disposed. The display substrate includes an array substrate, pixel define layers on the array substrate, pixel support layers on a side of the pixel define layers away from the array substrate, and second electrodes each located on a side of each of the pixel support layers away from each of the pixel define layers. The cover plate includes a first substrate, a touch sensor layer and a protective layer which are disposed on the first substrate, wherein multiple openings are disposed on the touch sensor layer, and are covered by the protective layer. An orthographic projection of each opening on the array substrate at least partially overlaps with that of a surface on a side of each pixel support layer away from the array substrate.

According to the display panel provided by the embodiment of the present disclosure, the openings are disposed on positions of the touch sensor layer corresponding to the pixel support layers, and the openings are covered by the protective layer, reducing the parasitic capacitances generated by the second electrodes above the pixel support layers and the touch sensor layer. In addition, the protective layer is etched between multiple openings, reducing the parasitic capacitances generated by the second electrodes between the pixel support layers and the touch sensor layer. The display panel of the present disclosure has advantages of the simple preparation process, the high production efficiency, and the low production cost and high yield, thus it has a great application prospect.

Hereinafter, the technical schemes of the present disclosure will be explained in detail through exemplary embodiments.

Figure 1A:
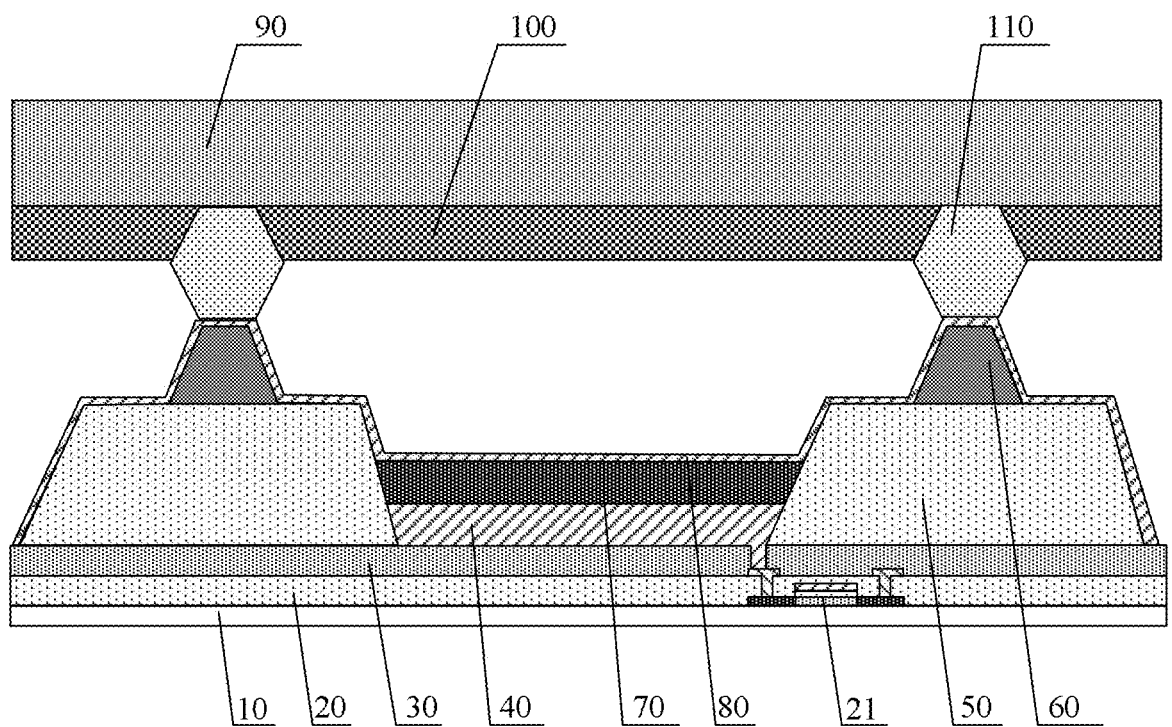
FIG. 1A is a schematic diagram of a structure of a display panel according to an embodiment of the present disclosure.

FIG. 1A is a schematic diagram of a structure of a display panel according to an embodiment of the present disclosure. The display panel of the present embodiment is a top emission structure. The main structure of the display panel of the embodiment includes multiple pixel units disposed in a matrix, and each pixel unit includes multiple sub-pixels. As shown in FIG. 1A, the display panel of this embodiment includes a display substrate and a cover plate which are oppositely disposed.

The display substrate includes an array substrate 10, pixel define layers 50 on the array substrate 10, pixel support layers 60 on a side of the pixel define layers 50 away from the array substrate 10, and second electrodes 80 each located on a side of each pixel support layer 60 away from each pixel define layer 50.

Figure 1B:
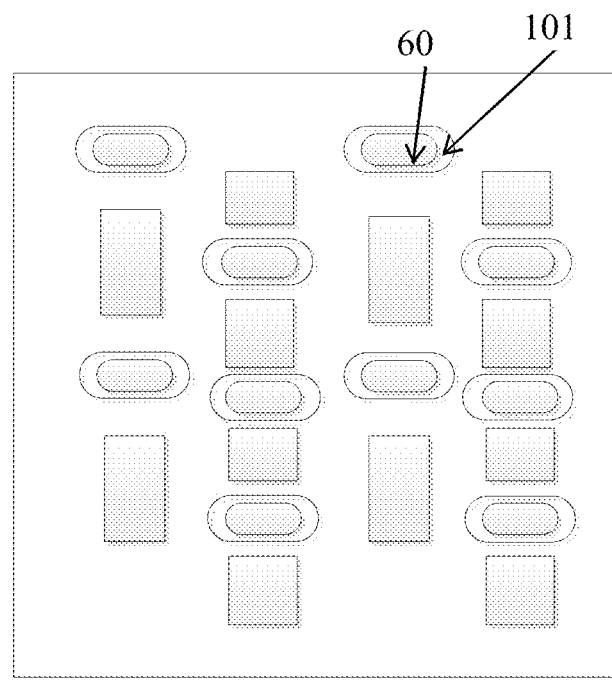
FIG. 1B is a schematic top view of a structure of a display panel (a first substrate is not shown) according to an embodiment of the present disclosure.

As shown in FIG. 1B and FIG. 9, the cover plate includes a first substrate 90, a touch sensor layer 100 and a protective layer 110 which are disposed on the first substrate 90, and multiple openings 101 are disposed on the touch sensor layer 100; the protective layer 110 covers the multiple openings 101; an orthographic projection of each opening 101 on the array substrate 10 at least partially overlaps with, such as coincides with, that of a surface on a side of each pixel support layer 60 away from the array substrate 10. As an example, the orthographic projection of the opening 101 overlaps fully the orthographic projection of the pixel support layer 60.

In an exemplary embodiment, the protective layer 110 includes multiple protective columns disposed at intervals, and the multiple protective columns cover the openings 101.

In an example of this embodiment, each protective column may cover one or more openings 101.

In an exemplary embodiment, a section (e.g., a longitudinal section) of the protective column is hexagonal.

In an exemplary embodiment, at least part of side surfaces of the multiple protective columns contact with the touch sensor layer.

In an exemplary embodiment, a length of a protective column in a direction perpendicular to the cover plate is greater than a length of the touch sensor layer 100 in the direction perpendicular to the cover plate.

In an exemplary embodiment, the second electrode 80 between adjacent pixel define layers 50, protective columns and the touch sensor layer 100 form an enclosed space, and the closed space is in a vacuum state or filled with nitrogen or an inert gas.

In an exemplary embodiment, a part of the second electrode 80 is sandwiched by the protective column and the pixel support layer.

In an exemplary embodiment, the second electrodes 80 contact with the multiple protective columns and the pixel support layers.

In an exemplary embodiment, the second electrodes 80 contact with a part of the pixel define layers 50.

In an exemplary embodiment, the display substrate further includes a pixel structural layer 20 on the array substrate. The pixel structural layer 20 includes multiple gate lines and multiple data lines, which intersect vertically to define multiple pixel units, and each pixel unit includes at least three sub-pixels, and each sub-pixel includes a thin film transistor (TFT) 21.

In an exemplary embodiment, the display substrate further includes a planarization (PLN) layer 30 on the pixel structural layer 20, the planarization layer 30 is provided with via holes exposing the thin film transistors 21.

In an exemplary embodiment, the display substrate further includes first electrodes 40 each located in a pixel opening area formed by the planarization layer 30 and the pixel define layers 50, wherein the first electrode 40 of each sub-pixel is connected to a drain electrode of the thin film transistor 21 in the sub-pixel.

In an exemplary embodiment, the display substrate further includes organic light emitting layers 70 each located in the pixel opening area formed by the planarization layer 30 and the pixel define layers 50. The organic light emitting layer 70 is connected with the first electrode 40.

In an exemplary embodiment, the second electrode 80 contacts with the organic light emitting layer 70.

The technical schemes of the embodiment are described below in further detail through the preparation process of the display panel of this embodiment. The "patterning process" in this embodiment includes film layer deposition, coating of photoresist, mask exposure, development, etching, stripping of photoresist, and so on. The "photolithography process" in this embodiment includes film layer coating, mask exposure, development, etc. Processes such as sputtering, chemical vapor deposition may be adopted for deposition, which are not limited here.

The preparation process of the display panel in this embodiment mainly include: Act one: respectively preparing the display substrate and the cover plate; and Act two: bonding and encapsulating the display substrate and the cover plate.

The preparation of the display substrate in Act one includes the following (1)-(7).

Figure 2:
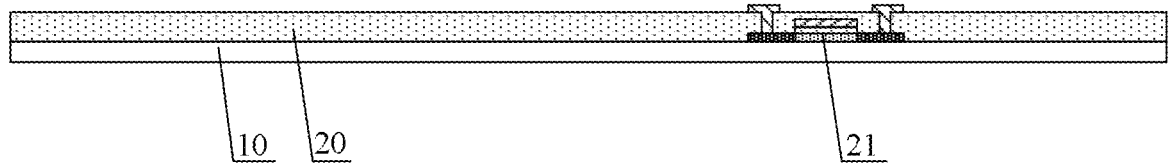
FIG. 2 is a schematic diagram of an array substrate after a pixel structural layer pattern is prepared according to an embodiment of the present disclosure.

(1) Forming a pixel structural layer (20) pattern on the array substrate 10 as shown in FIG. 2. The pixel structural layer 20 includes multiple gate lines and multiple data lines, which intersect vertically to define multiple pixel units disposed in a matrix, and each pixel unit includes at least three sub-pixels, and each sub-pixel includes a thin film transistor (TFT) 21. In this embodiment, a pixel unit may include three sub-pixels, namely red sub-pixel R, green sub-pixel G and blue sub-pixel B. Of course, the scheme of this embodiment is also applicable to the case where a pixel unit includes four sub-pixels (red sub-pixel R, green sub-pixel G, blue sub-pixel B and white sub-pixel W). In this embodiment, a preparation process of the pixel structural layer 20 may include, for example, cleaning the substrate first, then preparing an active layer on the substrate through a patterning process, then forming a first insulating layer covering the active layer, forming gate lines and gate electrodes on the first insulating layer, then forming a second insulating layer covering the gate lines and the gate electrodes, and forming data lines, source electrodes and drain electrodes on the second insulating layer. The thin film transistor may be a bottom gate structure or a top gate structure, an amorphous silicon (a-Si) thin film transistor, a low temperature polysilicon (LTPS) thin film transistor or an oxide thin film transistor, which is not limited hereto. In practice, the array substrate may be made of high light transmittance materials such as glass, quartz, polyalkene resin, polyethylene naphthalate resin, polyimide resin, polyethylene terephthalate plastic, phenolic resin, or polymer soft film with surface treatment.

Figure 3:
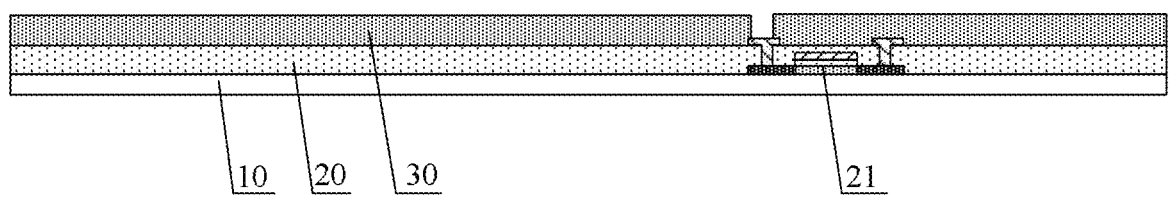
FIG. 3 is a schematic diagram of an array substrate after a planarization layer pattern is formed according to an embodiment of the present disclosure.

(2) Coating a first flat film on the array substrate 10 where the above pattern is formed to form a planarization (PLN) layer 30 covering the whole array substrate 10, forming via holes on the first planarization layer 30 through a patterning process, and etching off the planarization layer 30 in the via holes to expose surfaces of the drain electrodes of the thin film transistors 21, as shown in FIG. 3.

Figure 4:
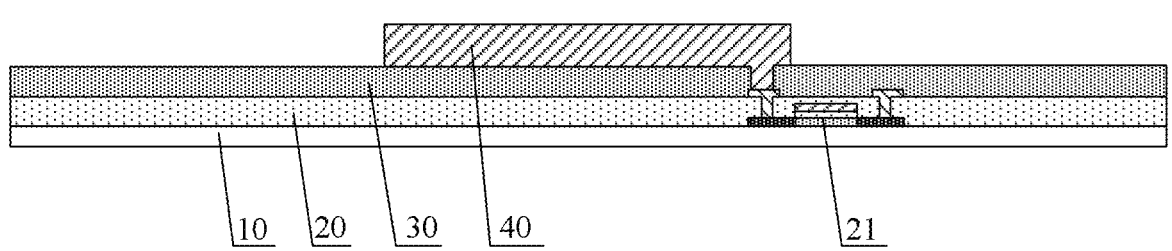
FIG. 4 is a schematic diagram of an array substrate after a first electrode pattern is formed according to an embodiment of the present disclosure.

(3) Forming a first electrode (40) pattern on the substrate where the aforementioned patterns are formed. Forming the first electrode (40) pattern includes depositing a first metal film on the substrate where the above patterns are formed, coating a layer of photoresist on the first metal film, exposing the photoresist with a single tone mask, forming unexposed areas where the first electrodes are located, forming fully-exposed areas at other positions, developing and removing the photoresist in the fully-exposed areas, then etching off the first metal film in the fully-exposed areas, stripping off the photoresist to form the first electrode (40) pattern, wherein the first electrode 40 of each sub-pixel is connected to the drain electrode of the thin film transistor 21 in the sub-pixel, as shown in FIG. 4. Since the display panel of this embodiment is a top emission structure, the first electrode is a reflective electrode, and metals with high reflectivity may be used for the first electrode, such as argentum (Ag), gold (Au), palladium (Pd), platinum (Pt), etc., or alloys of these metals, or composite layers of these metals. In practice, the composite layer structure of an indium tin oxide (ITO) layer and a metal reflective layer may also be used, which has good conductivity, high reflectivity and good morphological stability.

Figure 5:
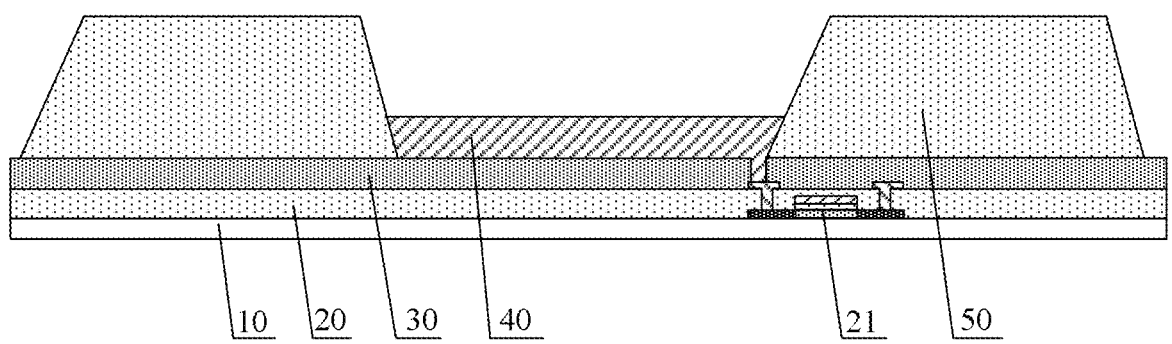
FIG. 5 is a schematic diagram of an array substrate after a pixel define layer pattern is formed according to an embodiment of the present disclosure.

(4) Forming a pixel define layer (50) pattern on the substrate where the above patterns are formed. Forming the pixel define layer (50) pattern includes coating a pixel defining film on the substrate where the above patterns are formed, exposing and developing the pixel defining film with a single tone mask to form the pixel define layer (50) pattern, as shown in FIG. 5. The pixel define layers 50 are used to define a pixel opening area in each sub-pixel, and the first electrode 40 is exposed by the pixel opening area. In this embodiment, the pixel define layer may be made of polyimide, acrylic or polyethylene terephthalate.

Figure 6:
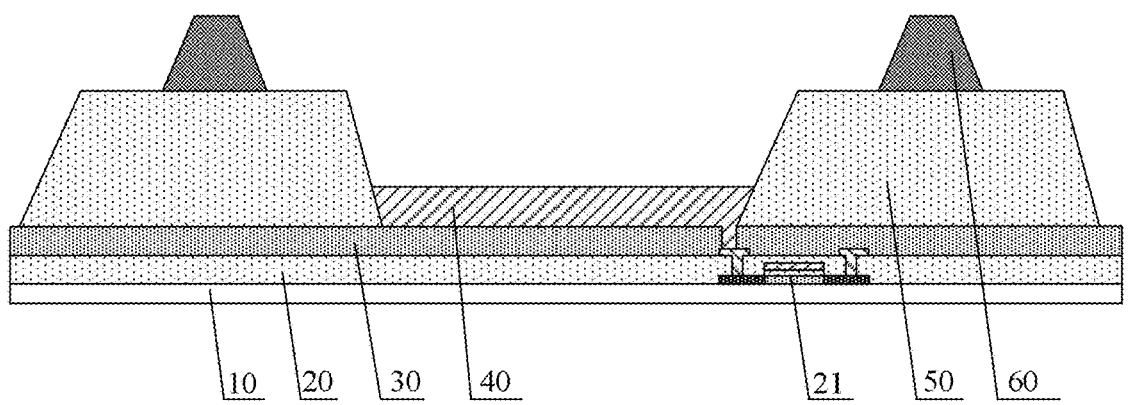
FIG. 6 is a schematic diagram of an array substrate after a pixel support layer pattern is formed according to an embodiment of the present disclosure.

(5) Coating an organic material film on the substrate where the above patterns are formed, and forming a pixel support (PS) layer (60) pattern through mask, exposure and development processes, wherein the pixel support layers 60 are disposed on a side of the pixel define layers away from the array substrate, as shown in FIG. 6. The pixel support layers 60 are used to support the mask, thereby avoiding the mask from directly contacting with the film layer to be formed when the film layer is formed on the pixel define layers 50.

Figure 7:
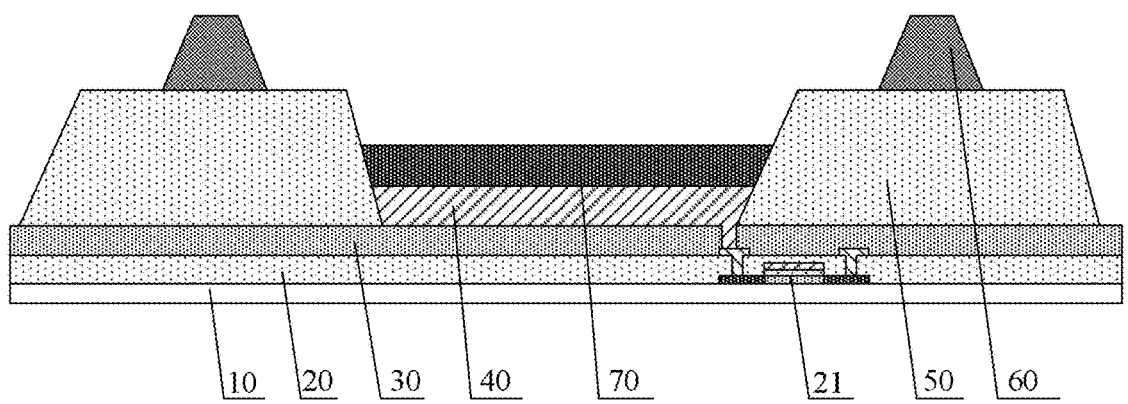
FIG. 7 is a schematic diagram of an array substrate after an organic light emitting layer pattern is formed according to an embodiment of the present disclosure.

(6) Forming organic light emitting layers 70 on the substrate where the above patterns are formed, as shown in FIG. 7. Each organic light-emitting layer 70 may include a Hole Injection Layer (HIL), a Hole Transport Layer (HTL), a light-EMitting Layer (EML), an Electron Transport Layer (ETL) and an Electron Injection Layer (EIL) which are stacked, wherein the Hole Transport Layer (HTL), the light-EMitting Layer (EML), the Electron Transport Layer (ETL) and the Electron Injection Layer (EIL) are sequentially disposed on the Hole Injection Layer. The organic light-emitting layer 70 is formed in the pixel opening area to connect the organic light-emitting layer 70 with the first electrode 40. Light emission control of the organic light emitting layer 70 is achieved for the connection between the first connection electrode 40 and the drain electrode of the thin film transistor 21.

Figure 8:
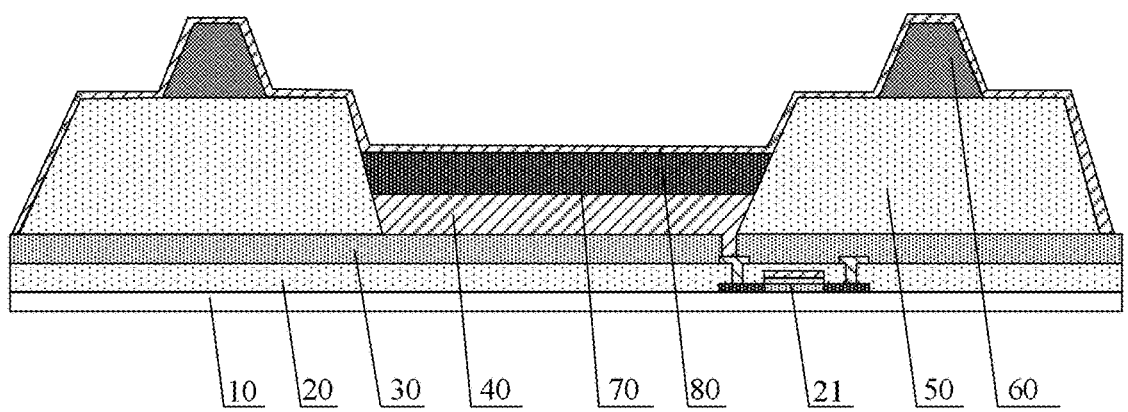
FIG. 8 is a schematic diagram of an array substrate after a second electrode pattern is formed according to an embodiment of the present disclosure.

(7) Forming a second electrode (80) pattern on the substrate where the above patterns are formed. Forming the second electrode (80) pattern includes depositing a second metal film on the substrate where the above patterns are formed, and patterning the second metal film through a patterning process to form the second electrode (80) pattern, as shown in FIG. 8. Since the display panel in this embodiment is the top emission structure, the second electrode may be a transmissive electrode or a semi-transflective electrode. The transmissive electrode may be made of one of metal materials such as magnesium (Mg), argentum (Ag), aluminum (Al), copper (Cu), lithium (Li), or an alloy of the above metals, and the semi-transflective electrode may be made of a semi-transflective metal.

The preparation of the display substrate of this embodiment is completed through the above process.

The preparation of the cover plate in Act one includes the following (1)-(2).

(1) Forming a conductive film on the first substrate 90 through a sputtering process, and then forming a touch sensor layer 100 covering the whole first substrate through the exposure and development process, forming multiple openings 101 on the touch sensor layer through a patterning process, and the touch sensor layer 100 in each opening 101 is etched off to expose a surface of the first substrate 90, as shown in FIG. 9. The material of the touch sensor layer may be at least one of indium tin oxide (ITO), indium zinc oxide (IZO) or indium gallium zinc oxide (IGZO).

(2) Forming a protective layer 110 on a side of the touch sensor layer 100 away from the first substrate 90, wherein the protective layer 110 may be made of silicon oxide, silicon nitride or a composite of silicon oxide or silicon nitride, the embodiments of the present disclosure are not limited thereto. As shown in FIG. 10, the protective layer 110 between multiple openings 101 is etched to form multiple protective columns disposed at interval, which cover the openings 101.

Through the above acts, the preparation of the cover plate of this embodiment is complete.

The Act two includes: the cover plate (or the display substrate) is firstly turned over, and a surface on a side of the cover plate where a structural layer is formed faces a surface on a side of the display substrate where a structural layer is formed; the cover plate is aligned with the display substrate, and then the cover plate and the display substrate are bonded and encapsulated; protective columns on the cover plate are connected to the second electrodes on the display substrate to form an organic light emitting diode display panel of this embodiment as shown in FIG. 1A. The protective column corresponds to the pixel support layer in position, and the second electrode between adjacent pixel define layers, the protective columns and the touch sensor layer form an enclosed space.

In an exemplary embodiment, the cover plate and the display substrate are bonded and encapsulated in vacuum, nitrogen or an inert gas. Therefore, the enclosed space formed by the second electrodes between adjacent pixel define layers, the protective columns and the touch sensor layer may be vacuum or filled with nitrogen or the inert gas. Since a dielectric constant of the vacuum, nitrogen or inert gas is smaller than that of a protective layer (such as SiOx), which may effectively reduce the parasitic capacitance herein. Commonly used natural gases, such as argon (Ar), helium (He), neon (Ne), krypton (Kr), xenon (Xe), or synthetic inert gases may be used as the inert gas.

It can be seen from the above preparation process that according to the display panel provided by the embodiment of the present disclosure, parasitic capacitances are not formed in the areas above the pixel support layers by etching off the corresponding touch sensor metal above the pixel support layers, the parasitic capacitances are the main affecting factor herein. In addition, the protective layer is etched off in the areas between adjacent pixel support layers (positions with no pixel support layers), so that the capacitance medium herein is the vacuum, nitrogen or inert gas, and the dielectric constant is smaller than that of the protective layer, which may reduce the parasitic capacitances in the areas between adjacent pixel support layers. According to the present disclosure, a channel capacitance is changed by changing the morphology of the protective layer 110 and the touch sensor layer 100, so that the parasitic capacitance between the cathode and the touch sensor layer is effectively reduced, and the touch sensitivity is improved. Moreover, it is simple to implement the process, and the process can be achieved only by modifying the mask of the cover plate process, thus the display panel of the present disclosure has a good application prospect.

Although the display panel of this embodiment is described with a top emission structure, the scheme of this embodiment is also applicable to a bottom emission structure or a double-sided emission structure, and is also applicable to a large-size or small-size OLED display panel.

An embodiment of the present disclosure further provides a preparation method of a display panel. As shown in FIG. 11, the preparation method of the display panel of the embodiment of the present disclosure includes the following acts S1-S2.

In S1, a display substrate and a cover plate are respectively formed, wherein the display substrate includes an array substrate, pixel define layers on the array substrate, pixel support layers on a side of the pixel define layers away from the array substrate, and second electrodes each located on a side of each of the pixel support layers away from each of the pixel define layers; the cover plate includes a first substrate, a touch sensor layer and a protective layer which are disposed on the first substrate, wherein multiple openings are disposed on the touch sensor layer and are covered by the protective layer.

In S2, the display substrate and the cover plate are bonded and encapsulated, and an orthographic projection of each of the openings on the array substrate at least partially overlaps with that of a surface on a side of each of the pixel support layers away from the array substrate.

In an exemplary embodiment, forming a cover plate is formed includes: the touch sensor layer on the first substrate is formed, and multiple openings are formed on the touch sensor layer; and the protective layer is formed on the touch sensor layer, wherein the protective layer covers the multiple openings.

In an exemplary embodiment, forming a cover plate further includes: a protective layer between multiple openings is etched to form multiple protective columns disposed at interval which cover the multiple openings.

In an exemplary embodiment, a section (e.g., longitudinal section) of each protective column is hexagonal.

In an exemplary embodiment, a length of each protective column in a direction perpendicular to the cover plate is greater than that of the touch sensor layer in the direction perpendicular to the cover plate.

In an exemplary embodiment, bonding and encapsulating the display substrate and the cover plate includes: the display substrate and the cover plate are bonded and encapsulated in vacuum, nitrogen or an inert gas, so that an enclosed space formed by a second electrode between adjacent pixel define layers, protective columns and a touch sensor layer is in a vacuum state or filled with the nitrogen or the inert gas.

An embodiment provides a preparation method of a display panel. In the preparation method the openings are disposed on positions of the touch sensor layer corresponding to the pixel support layers, and the openings are covered by the protective layer, reducing the parasitic capacitances generated by the second electrodes above the pixel support layers and the touch sensor layer. In addition, the protective layer is etched between multiple openings, reducing the parasitic capacitances generated by the second electrodes between the pixel support layers and the touch sensor layer. The preparation method of the display panel has advantages of the simple preparation process, the high production efficiency, and the low production cost and high yield, thus it has a great application prospect.

An embodiment of the present disclosure further provides a display apparatus which includes the display panel in the aforementioned embodiments. The display apparatus may be any product or component with a display function, such as a mobile phone, a tablet computer, a television, a display, a notebook computer, a digital photo frame, a navigator.

In the description of the present disclosure, it should be understood that an orientation or position relationship indicated by the terms "middle", "upper", "lower", "front", "rear", "vertical", "horizontal", "top", "bottom", "inner", "outer" and the like is based on the orientation or position relationship shown in the accompanying drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

In the description of embodiments of the present disclosure, it should be noted that unless otherwise clearly specified and defined, the terms "install", "connect", "couple" should be broadly interpreted, for example, it may be connected fixedly or connected detachably, or integrated; it may be a mechanical connection or an electrical connection; it may be directly connected, or may be indirectly connected through an intermediary, or may be an internal connection between two elements. Those of ordinary skill in the art may understand the specific meanings of the above mentioned terms in the present disclosure according to specific situations.

Although implementations disclosed in the present disclosure are as the above, the described contents are only implementations used for facilitating understanding the present disclosure, and are not used to limit the present disclosure. Any person skilled in the art to which the present disclosure pertains may make any modifications and variations in the form and details of implementation without departing from the spirit and the scope of the present disclosure, but the patent protection scope of the present disclosure shall still be subject to the scope defined in the appended claims.

What we claim is:

1. A display panel, comprising a display substrate and a cover plate that are oppositely disposed, wherein:
   the display substrate comprises an array substrate, pixel define layers on the array substrate, pixel support layers on a side of the pixel define layers away from the array substrate, and second electrodes each located on a side of each of the pixel support layers away from each of the pixel define layers;
   the cover plate comprises a first substrate, a touch sensor layer and a protective layer, wherein the touch sensor layer and the protective layer are disposed on the first substrate, wherein a plurality of openings are disposed on the touch sensor layer; the plurality of openings are covered by the protective layer; an orthographic projection of each of the plurality of openings on the array substrate at least partially overlaps with that of a surface on a side of each of the pixel support layers away from the array substrate;
   wherein the protective layer comprises a plurality of protective columns disposed at intervals, and the plurality of protective columns cover the openings; and
   wherein a part of the second electrodes is sandwiched by the protective column and the pixel support layer; or the second electrodes contact with the plurality of protective columns and the pixel support layers.

2. The display panel of claim 1, wherein the orthographic projection of each of the plurality of openings on the array substrate coincides with that of the surface on the side of each of the pixel support layers away from the array substrate.

3. The display panel of claim 1, wherein a section of each of the plurality of protective columns is hexagonal.

4. The display panel of claim 1, wherein a length of each of the plurality of protective columns in a direction perpendicular to the cover plate is greater than that of the touch sensor layer in the direction perpendicular to the cover plate.

5. The display panel of claim 4, wherein a second electrode between adjacent pixel define layers, protective columns and the touch sensor layer form an enclosed space which is in a vacuum state or filled with nitrogen or an inert gas.

6. The display panel of claim 1, wherein at least part of side surfaces of the plurality of protective columns contact with the touch sensor layer.

7. A display apparatus, comprising a display panel which comprises a display substrate and a cover plate that are oppositely disposed, wherein:
   the display substrate comprises an array substrate, pixel define layers on the array substrate, pixel support layers on a side of the pixel define layers away from the array substrate, and second electrodes each located on a side of each of the pixel support layers away from each of the pixel define layers;
   the cover plate comprises a first substrate, a touch sensor layer and a protective layer, wherein the touch sensor layer and the protective layer are disposed on the first substrate, wherein a plurality of openings are disposed on the touch sensor layer; the plurality of openings are covered by the protective layer; an orthographic projection of each of the plurality of openings on the array substrate at least partially overlaps with that of a surface on a side of each of the pixel support layers away from the array substrate;
   the protective layer comprises a plurality of protective columns disposed at intervals, and the plurality of protective columns cover the openings; and
   a part of the second electrodes is sandwiched by the protective column and the pixel support layer; or the second electrodes contact with the plurality of protective columns and the pixel support layers.

8. The display apparatus of claim 7, wherein the orthographic projection of each of the plurality of openings on the array substrate coincides with that of the surface on the side of each of the pixel support layers away from the array substrate.

9. The display apparatus of claim 7, wherein a section of each of the plurality of protective columns is hexagonal.

10. The display apparatus of claim 7, wherein a length of each of the plurality of protective columns in a direction perpendicular to the cover plate is greater than that of the touch sensor layer in the direction perpendicular to the cover plate.

11. The display apparatus of claim 10, wherein a second electrode between adjacent pixel define layers, protective columns and the touch sensor layer form an enclosed space which is in a vacuum state or filled with nitrogen or an inert gas.

12. The display panel of claim 7, wherein at least part of side surfaces of the plurality of protective columns contact with the touch sensor layer.

13. A preparation method of a display panel, comprising:
   forming a display substrate and a cover plate respectively, wherein the display substrate comprises an array substrate, pixel define layers on the array substrate, pixel support layers on a side of the pixel define layers away from the array substrate, and second electrodes each located on a side of each of the pixel support layers away from each of the pixel define layers; the cover plate comprises a first substrate, a touch sensor layer and a protective layer, wherein the touch sensor layer and the protective layer are disposed on the first substrate, wherein a plurality of openings are disposed on the touch sensor layer, and the plurality of openings are covered by the protective layer; and
   bonding and encapsulating the display substrate and the cover plate, wherein an orthographic projection of each of the plurality of openings on the array substrate at least partially overlaps with that of a surface on a side of each of the pixel support layers away from the array substrate,
   wherein forming the cover plate comprises:
   forming the touch sensor layer on the first substrate, and forming the plurality of openings on the touch sensor layer;
   forming the protective layer on the touch sensor layer, wherein the plurality of openings are covered by the protective layer; and
   etching a protective layer between the plurality of openings to form a plurality of protective columns disposed at intervals, wherein the openings are covered by the plurality of protective columns, wherein bonding and encapsulating the display substrate and the cover plate comprises:

bonding and encapsulating the display substrate and the cover plate in vacuum, nitrogen or an inert gas, to make an enclosed space formed by a second electrode between adjacent pixel define layers, protective columns and the touch sensor layer be in a vacuum state or filled with the nitrogen or the inert gas; and connecting each of the plurality of protective columns on the cover plate to each of the second electrodes on the display substrate, wherein each of the plurality of protective columns corresponds to each of the pixel support layers in position, and the enclosed space is formed by the second electrode between adjacent pixel define layers, protective columns and the touch sensor layer.

* * * * *